(12) United States Patent
Huang

(10) Patent No.: US 11,805,640 B2
(45) Date of Patent: Oct. 31, 2023

(54) MANUFACTURING METHOD OF A SEMICONDUCTOR DEVICE USING A PROTECT LAYER ALONG A TOP SIDEWALL OF A TRENCH TO WIDEN THE BOTTOM OF THE TRENCH

(71) Applicant: NANYA TECHNOLOGY CORPORATION, New Taipei (TW)

(72) Inventor: Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 74 days.

(21) Appl. No.: 17/647,346

(22) Filed: Jan. 6, 2022

(65) Prior Publication Data
US 2023/0217650 A1   Jul. 6, 2023

(51) Int. Cl.
*H10B 12/00* (2023.01)

(52) U.S. Cl.
CPC ......... *H10B 12/488* (2023.02); *H10B 12/053* (2023.02); *H10B 12/34* (2023.02)

(58) Field of Classification Search
CPC .... H10B 12/053; H10B 12/34; H10B 12/488; H01L 21/76224
USPC .......................................................... 438/259
See application file for complete search history.

(56) References Cited

U.S. PATENT DOCUMENTS

2008/0203455 A1\* 8/2008 Jang ................. H01L 29/42376
257/E21.177
2021/0358920 A1   11/2021 Luo et al.

\* cited by examiner

*Primary Examiner* — Hoai V Pham
(74) *Attorney, Agent, or Firm* — CKC & Partners Co., LLC

(57) ABSTRACT

A semiconductor device includes a substrate, a passing word line in the substrate, and a dielectric structure surrounding the passing word line. The dielectric structure has an enlargement portion at a bottom of the dielectric structure, and a maximum width of the enlargement portion of the dielectric structure is wider than a width of a top of the dielectric structure.

9 Claims, 15 Drawing Sheets

MANUFACTURING METHOD OF A SEMICONDUCTOR DEVICE USING A PROTECT LAYER ALONG A TOP SIDEWALL OF A TRENCH TO WIDEN THE BOTTOM OF THE TRENCH

BACKGROUND

Field of Disclosure

The present disclosure relates to a semiconductor device and a manufacturing method thereof.

Description of Related Art

A variety of semiconductor memory devices are used extensively in many consumer products. Illustrative examples of such memory devices include dynamic random access memory (DRAM) and flash memory devices. As the semiconductor technology has progressed into nanoscale technology, the sizes of the semiconductor memory devices and the components therein are gradually reduced. It is desirable to provide improved contact structures that can be disposed within a memory array for being connected to active regions.

SUMMARY

According to some embodiment of the present disclosure, a semiconductor device includes a substrate, a passing word line in the substrate, and a dielectric structure surrounding the passing word line. The dielectric structure has an enlargement portion at a bottom of the dielectric structure, and a maximum width of the enlargement portion of the dielectric structure is wider than a width of a top of the dielectric structure.

In some embodiments, the dielectric structure has a sidewall substantially vertical to the top of the dielectric structure, and the sidewall expands outwards at a height above a bottom of the passing word line, and the height is about 10 nm to about 20 nm above the bottom of the passing word line.

In some embodiments, the maximum width of the enlargement portion of the dielectric structure is about 1 nm to about 10 nm wider than the width of the top of the dielectric structure.

In some embodiments, the bottom of the passing word line is substantially leveled with the enlargement portion at the maximum width.

In some embodiments, the top of the dielectric structure gets wider toward the bottom of the dielectric structure.

In some embodiments, the semiconductor device further includes an active word line adjacent to the dielectric structure, wherein the active word line is separated from the dielectric structure by the substrate.

In some embodiments, the semiconductor device further includes a dielectric layer over the passing word line.

According to some embodiment of the present disclosure, a manufacturing method of a semiconductor device includes the following steps. A hard mask layer is formed over a substrate. A first etching operation is performed by the hard mask layer to form a trench in the substrate. A sacrificial layer is formed at a bottom of the trench. A protection layer is formed along a sidewall of a top of the trench. The sacrificial layer at the bottom of the trench is removed such that a sidewall of the bottom of the trench is exposed. A second etching operation is performed to widen the bottom of the trench. The hard mask layer over the substrate and the protection layer along the sidewall of the trench are removed. A dielectric structure is formed in the trench, and a passing word line is formed in the dielectric structure.

In some embodiments, forming the protection layer along the sidewall of the trench includes following steps. A dielectric layer is conformally formed over the hard mask layer, the sacrificial layer and along the sidewall of the top of the trench. The dielectric layer over the hard mask layer and the sacrificial layer is etched back, such that the dielectric layer remaining along the sidewall of the top of the trench is etched back to become the protection layer along the sidewall of the top of the trench.

In some embodiments, the manufacturing method further includes forming a photoresist layer over the hard mask layer, and the photoresist layer exposes the protection layer and the sacrificial layer in the trench before removing the sacrificial layer at the bottom of the trench.

In some embodiments, the trench is widened from the protection layer along the sidewall of the trench.

In some embodiments, forming the sacrificial layer at the bottom of the trench includes depositing a sacrificial material in the trench, and etching back the sacrificial material to remove a portion of the sacrificial material at the top of the trench such that the sacrificial layer is formed at the bottom of the trench.

In some embodiments, the manufacturing method further includes forming an active word line adjacent to the dielectric structure during forming the passing word line, wherein the active word line is separated from the dielectric structure by the substrate.

In some embodiments, the second etching operation is a wet etching process.

In some embodiments, the bottom of the trench is widened such that a maximum width of the bottom of the trench is about 1 nm to about 10 nm wider than a width of the top of the trench.

In some embodiments, the manufacturing method further includes forming a dielectric layer over the passing word line.

The dielectric structure having the enlargement portion at the bottom can reduce disturbance caused by the passing word line to adjacent active word lines. Therefore, performance of the resulting semiconductor device may be enhanced.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
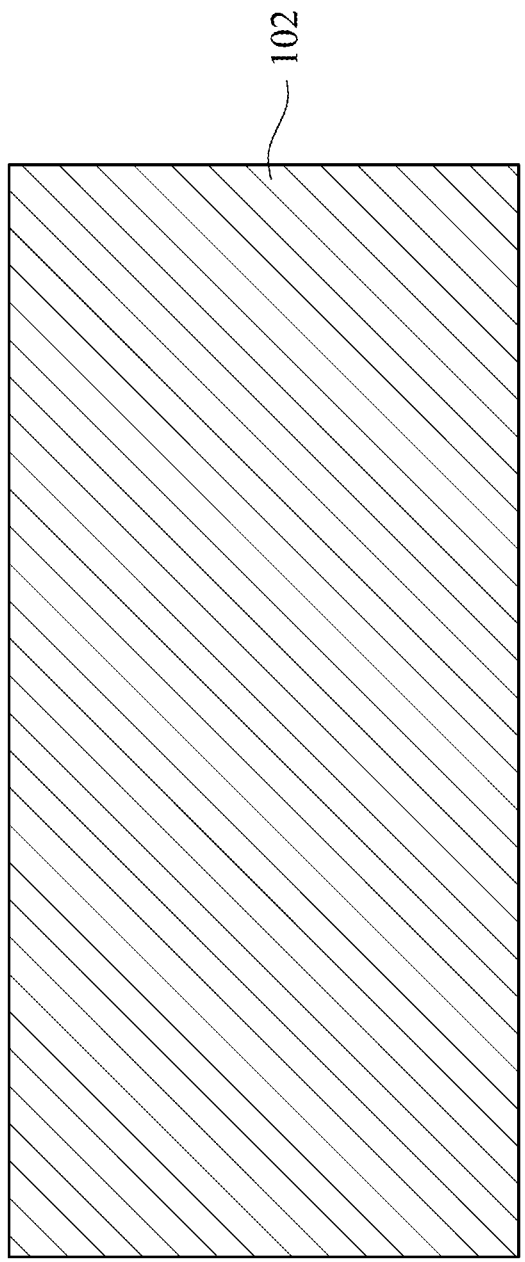
FIGS. 1-14 illustrate cross section views of intermediate stages of a manufacturing method of a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure are related to forming a dielectric structure, which has an enlargement portion at a bottom of the dielectric structure, surrounding a passing word line. The dielectric structure having the enlargement portion at the bottom can reduce disturbance caused by the passing word line to adjacent active word lines. Therefore, performance of the resulting semiconductor device may be enhanced.

FIGS. 1-14 illustrate cross section views of intermediate stages of a manufacturing method of a semiconductor device in accordance with some embodiments of the present disclosure. Referring to FIG. 1, a substrate 102 is provided. The substrate 102 may be made of any suitable materiel, such as semiconductor materiel. In some embodiments, the substrate 102 is a silicon substrate. Alternatively, the substrate 102 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 102 is doped with dopants to form p-type active regions and/or n-type active regions therein.

Figure 2:
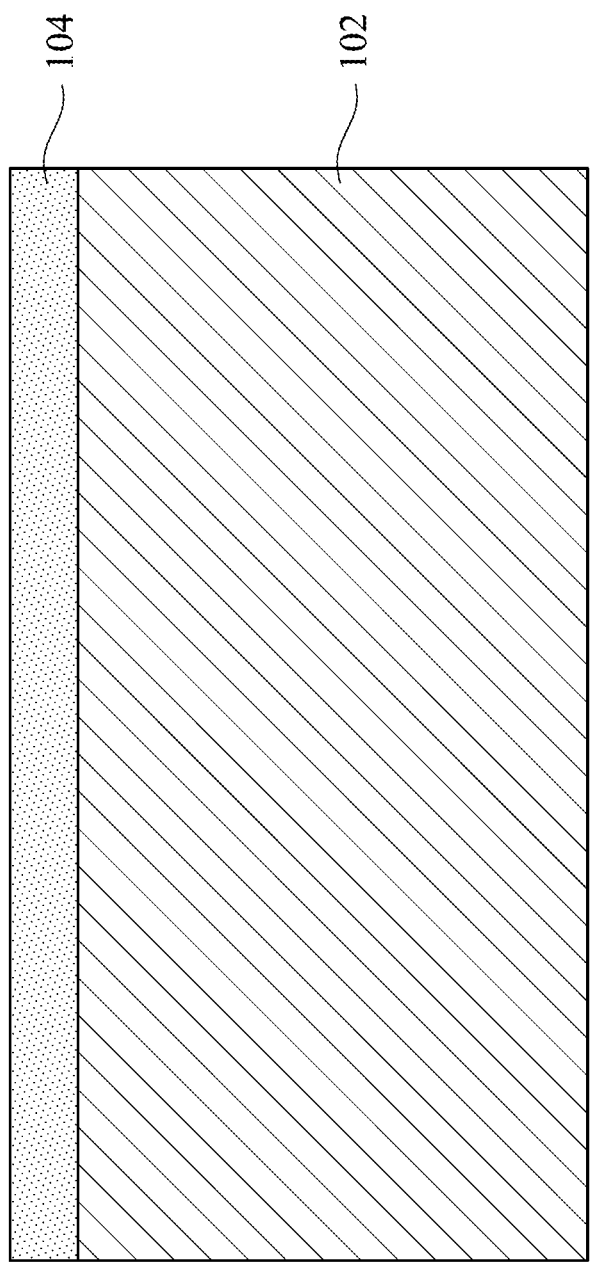

Referring to FIG. 2, a hard mask layer 104 is formed over the substrate 102. The hard mask layer 104 is used to prevent the underlying substrate 102 from damage resulting from subsequent processes and is made of different material from the substrate 102. The hard mask layer 104 may be made of any suitable dielectric material, such as SiN, SiO, SiON, combinations thereof, or the like. The hard mask layer 104 may be formed by any suitable method, such as chemical vapor deposition (CVD), physical vapor deposition (PVD), atomic layer deposition (ALD), or the like.

Figure 3:
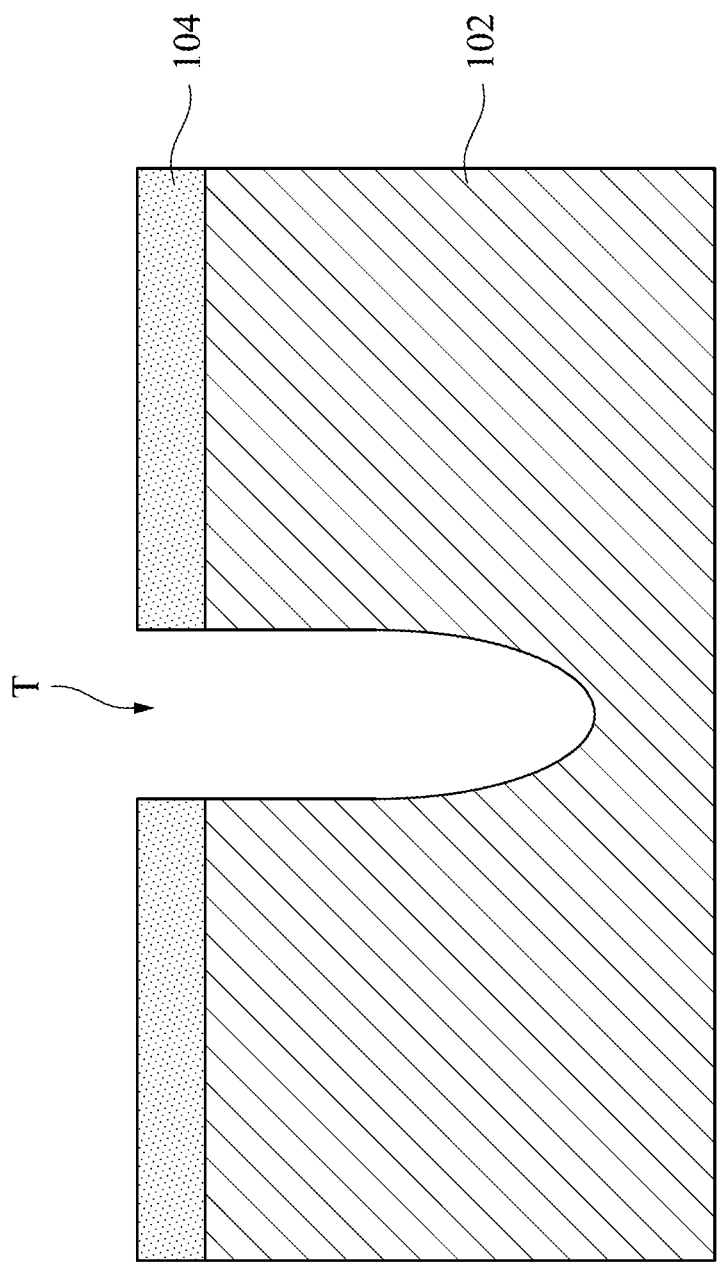

Referring to FIG. 3, a first etching operation is performed by using the hard mask layer 104 as a mask to form a trench T in the substrate 102. More specifically, a photoresist layer is first formed over the hard mask layer 104. The photoresist layer is patterned by using photo lithography to form a patterned photoresist layer, and then the hard mask layer 104 is patterned by the patterned photoresist layer to form the patterns in the hard mask layer 104. Subsequently, the patterns of the hard mask layer 104 are transferred to the underlying substrate 102 by the first etching operation. The first etching operation is an anisotropic etching, such that the substrate 102 is vertically etched to form the trench T. In some embodiments, the first etching operation is a dry etching operation. After forming the trench T in the substrate 102, the photomask may be removed by any suitable method, such as ashing or stripping. It is noted that although only one trench T is illustrated in FIG. 3, the number of the trench T is not limited and may be two or more.

Figure 4:
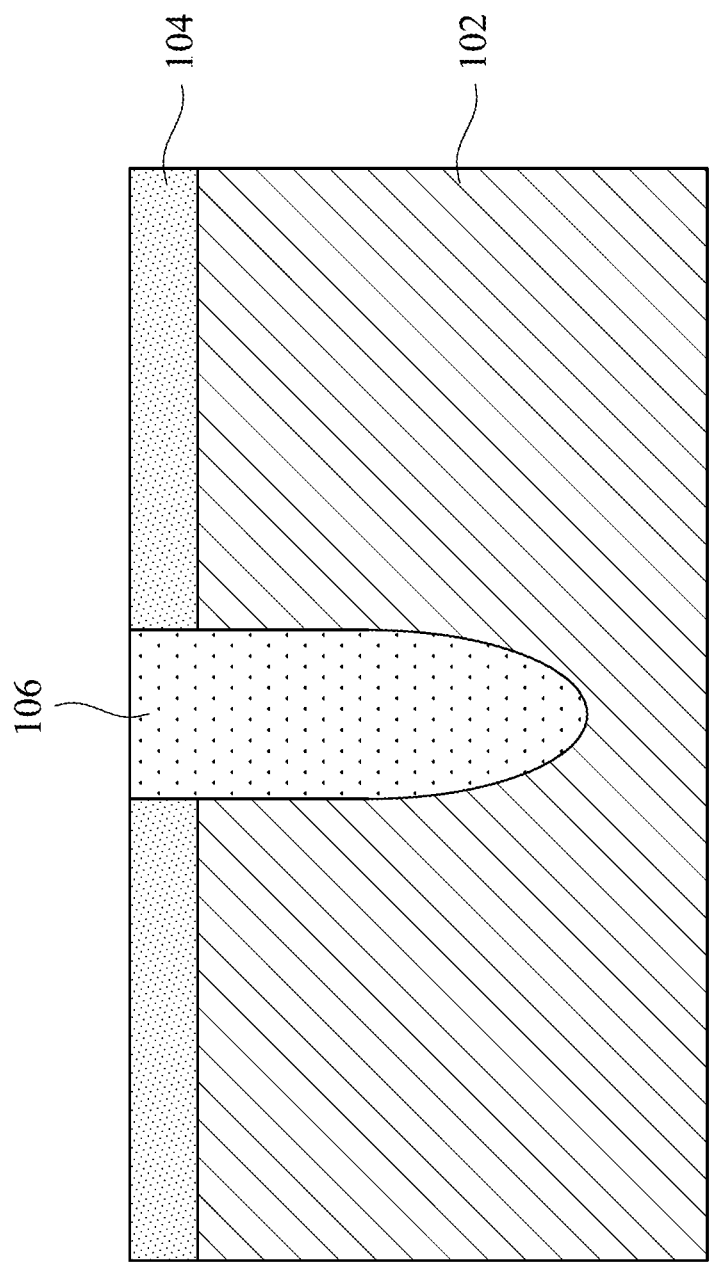

Referring to FIG. 4, a sacrificial material 106 is filled in the trench T. More specifically, the sacrificial material 106 may first be deposited over the hard mask layer 104 and in the trench T. A planarization process is then performed to remove the excess sacrificial material 106 over the hard mask layer 104. Therefore, the sacrificial material 106 is filled in the trench T. The sacrificial material 106 is a suitable dielectric material and is different from the material of the hard mask layer 104. Hence, the sacrificial material 106 has an etching selectivity with respect to the hard mask layer 104 and the substrate 102. In some embodiments, the sacrificial material 106 may include SiN, SiO, SiON, combinations thereof, or the like. For example, the sacrificial material 106 is oxide while the hard mask layer 104 is nitride, or vice versa.

Figure 5:
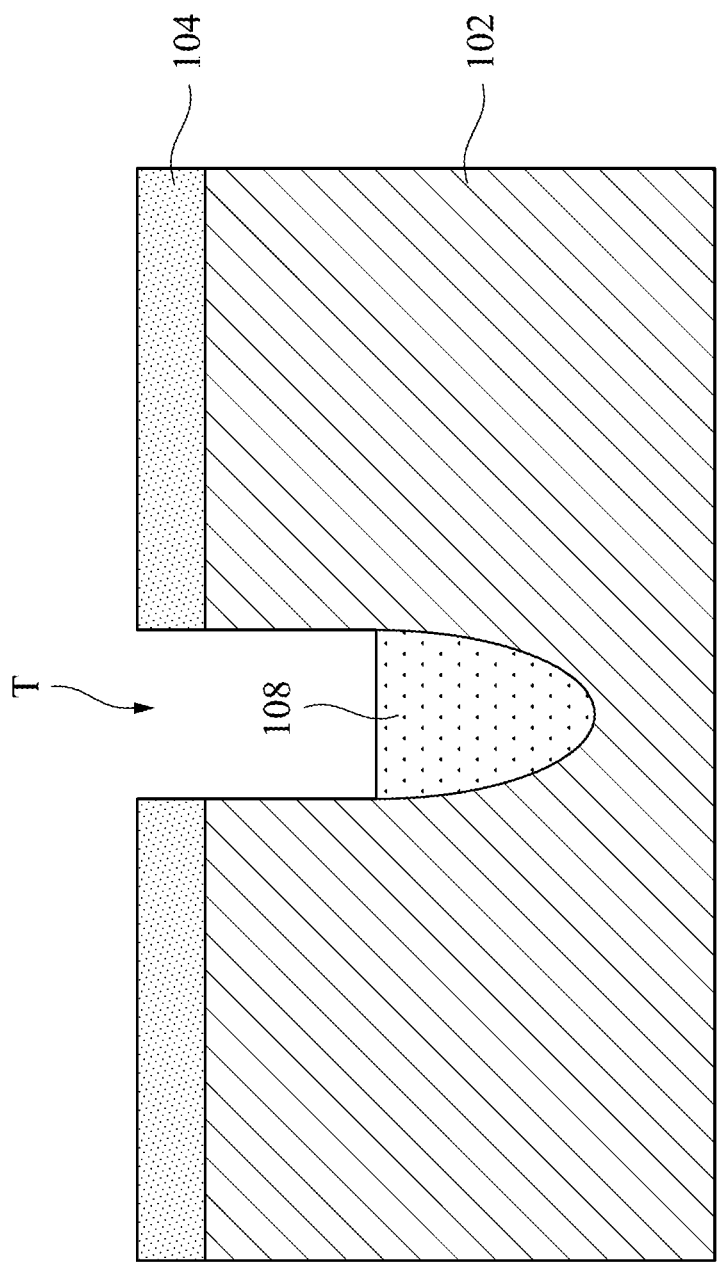

Referring to FIG. 5, a sacrificial layer 108 is formed at a bottom of the trench T. More specifically, the sacrificial material 106 in FIG. 4 is etched back to remove a portion of the sacrificial material 106 at the top of the trench T to form the sacrificial layer 108 at the bottom of the trench T. Therefore, an upper portion of the trench T is exposed in the substrate 102. The etching back process is an anisotropic etching process to vertically remove an upper portion of the sacrificial material 106. Due to the etching selectivity between the sacrificial material 106 and the substrate 102 and the hard mask layer 104, the substrate 102 and the hard mask layer 104 are not etched or barely etched during the etching back process. The height of the sacrificial layer 108 defines the location of the subsequently formed enlargement portion of the dielectric structure, and will be discussed in respect with FIG. 9.

Figure 6:
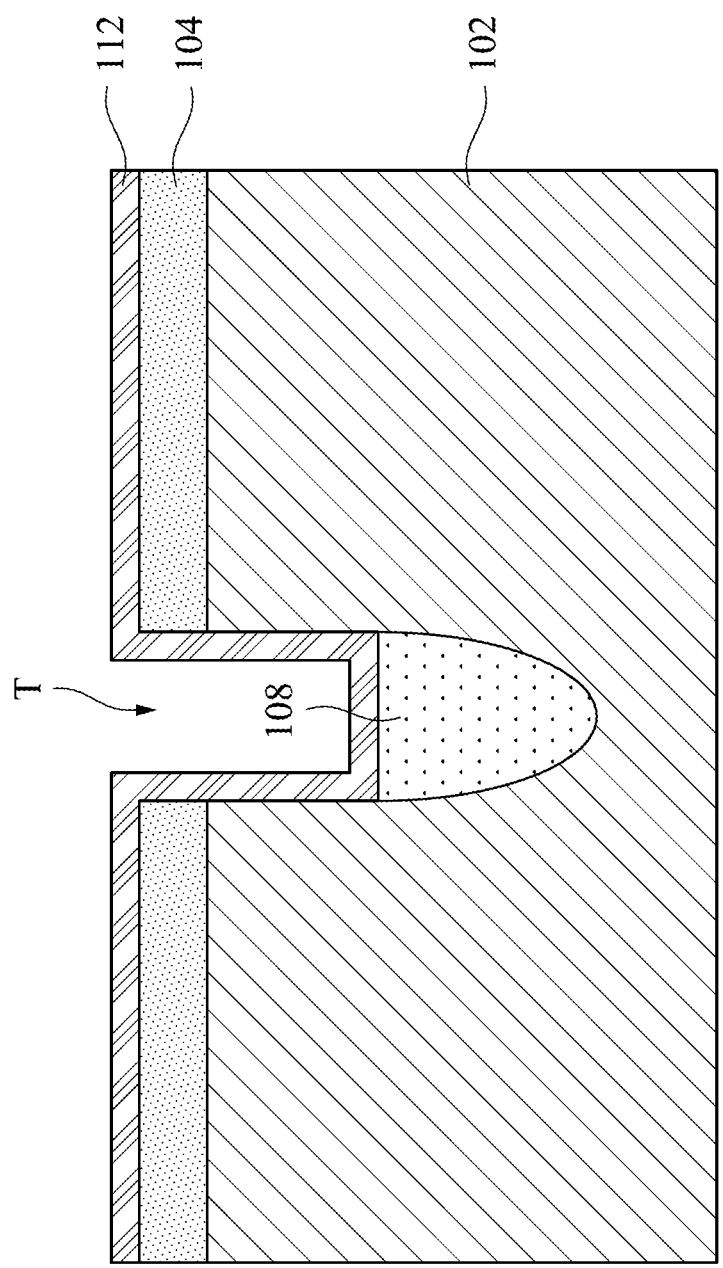

Referring to FIG. 6, a dielectric layer 112 is conformally formed over the hard mask layer 104, the sacrificial layer 108 and along the sidewall of a top of the trench T. The top of the trench T refers to the portion of the trench T which is not covered by the sacrificial layer 108. The dielectric layer 112 may be made of any suitable dielectric material. In some embodiments, the dielectric layer 112 may include SiN, SiO, SiON, combinations thereof, or the like, and the dielectric layer 112 and the hard mask layer 104 may include the same material. For example, the dielectric layer 112 and the hard mask layer 104 are both nitride. The dielectric layer 112 may be formed by any suitable method, such as CVD, PVD, ALD, or the like.

Figure 7:
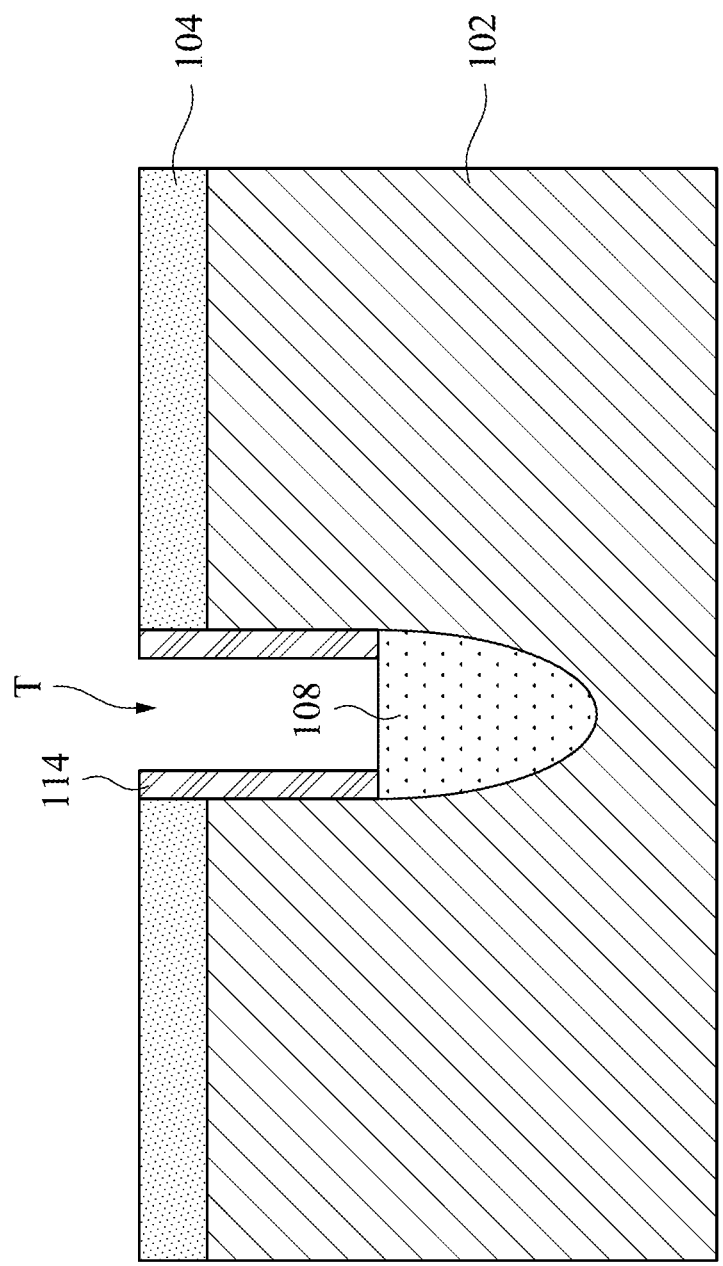

Referring to FIG. 7, protection layers 114 are formed along sidewalls of the top of the trench T. More specifically, the dielectric layer 112 over the hard mask layer 104 and the sacrificial layer 108 is etched back, such that the dielectric layer 112 remaining along the sidewall of the top of the trench T becomes the protection layers 114 along the sidewalls of the top of the trench T. In some embodiments, the etching back process of the dielectric layer 112 is an anisotropic process, so the dielectric layer 112 along the top of the sidewall of the trench T is not etched. After forming the protection layers 114 along the sidewalls of the top of the trench T, the top surface of the sacrificial layer 108 is exposed.

Figure 8:
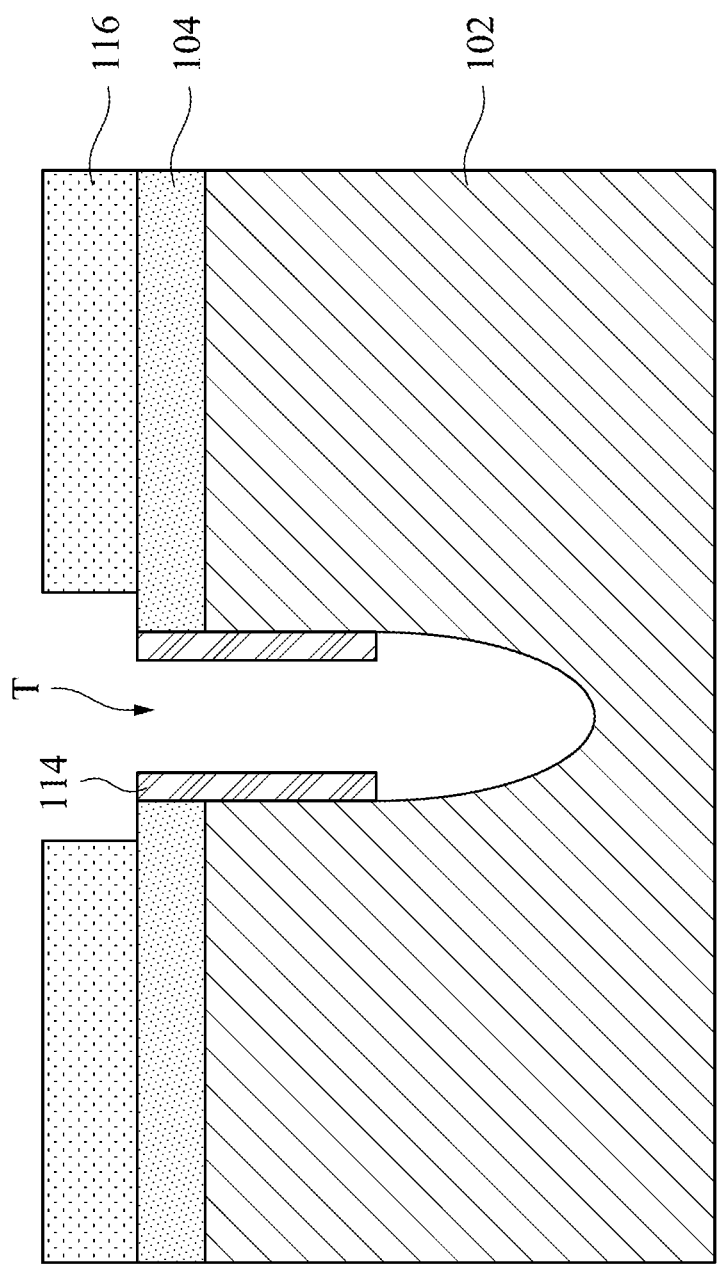

Referring to FIG. 8, the sacrificial layer 108 (see FIG. 7) at the bottom of the trench T is removed such that sidewalls of the bottom of the trench T are exposed. More specifically, a photoresist layer 116 is formed over the hard mask layer 104, and the photoresist layer 116 exposes the protection layers 114 and the sacrificial layer 108 in the trench T before removing the sacrificial layer 108 at the bottom of the trench T. In some embodiments, the width of an opening in the photoresist layer 116 is wider than the width of the trench T, so the photoresist layer 116 also exposes a portion of the hard mask layer 104. Subsequently, the sacrificial layer 108 at the bottom of the trench T is removed by a combination of a dry etching and a wet etching. Discussed in greater detail, the dry etching is first used to vertically remove a portion of the sacrificial layer 108 directly exposed in the trench T, in which the portion of the sacrificial layer 108 is not covered by the protection layers 114. The wet etching is then performed to remove the remaining sacrificial layer 108, such as the sacrificial layer 108 below the protection layers 114. In some embodiments, a solvent such as HF acid is used in the wet etching.

Figure 9:
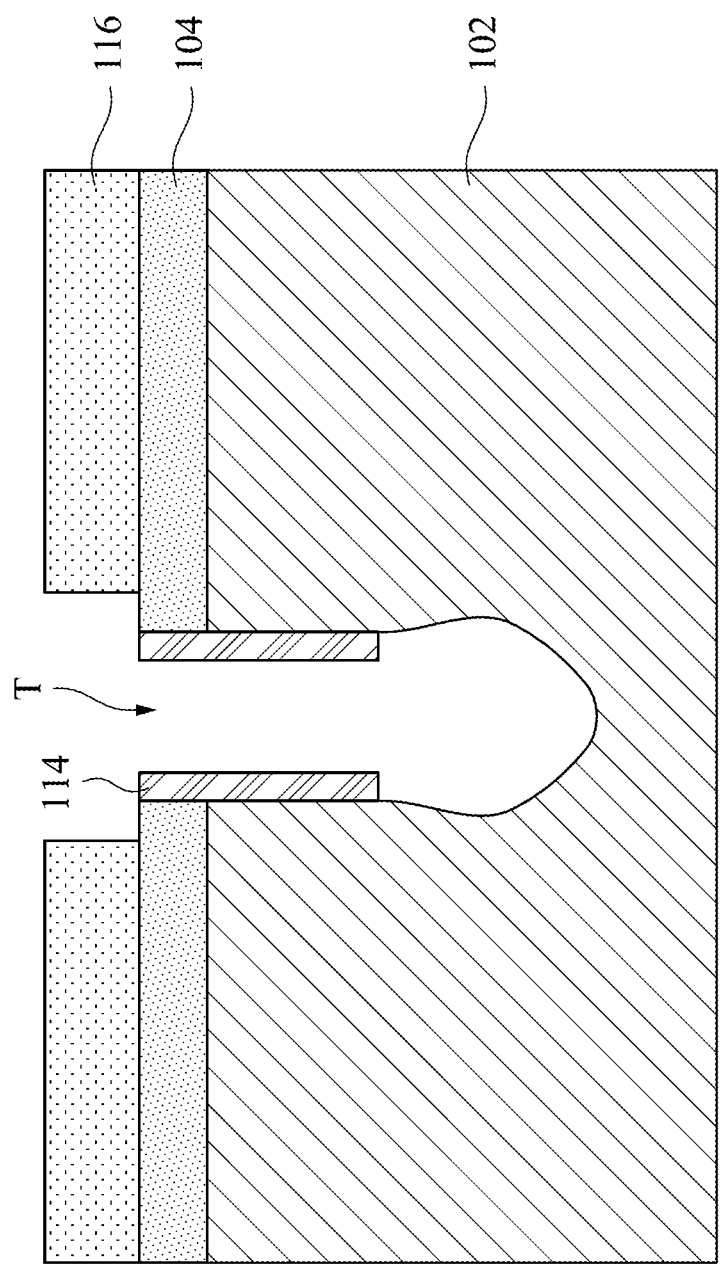

Referring to FIG. 9, a second etching operation is performed to widen the bottom of the trench T. More specifically, the protection layers 114 still cover the sidewalls of the top of the trench T after removing the sacrificial layer 108. The second etching operation is a wet isotropic etching that be able to etch the substrate 102 but unable to etch the protection layers 114. Therefore, the substrate 102 exposed in the trench T is etched to widen the trench T from the protection layers 114 along the sidewall of the trench T. Therefore, the width of the trench T is laterally increased, and the bottom of the trench T becomes relatively round. In some embodiments, an etchant such as ammonia peroxide mixture (APM) is used in the second etching.

Figure 10:
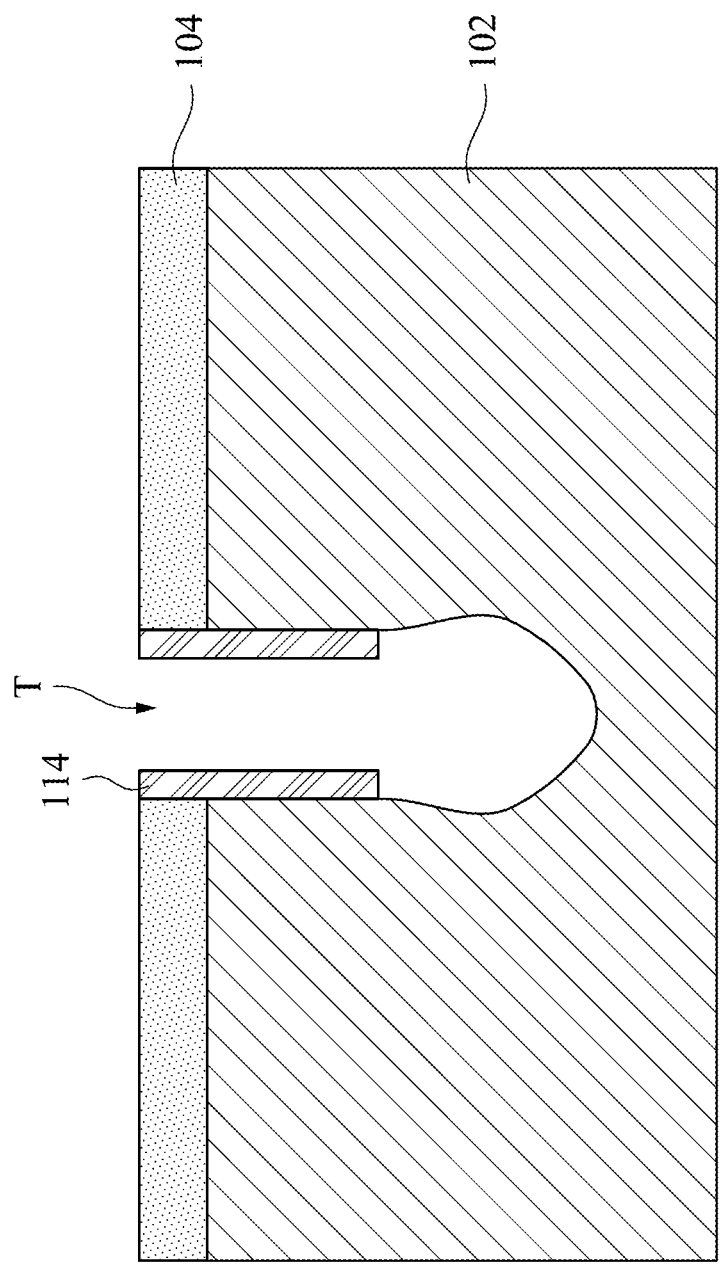

Referring to FIG. 10, the photoresist layer 116 is removed after the bottom of the trench T is widened. In some embodiments, the photoresist layer 116 is removed by stripping, such as oxygen ashing.

Figure 11:
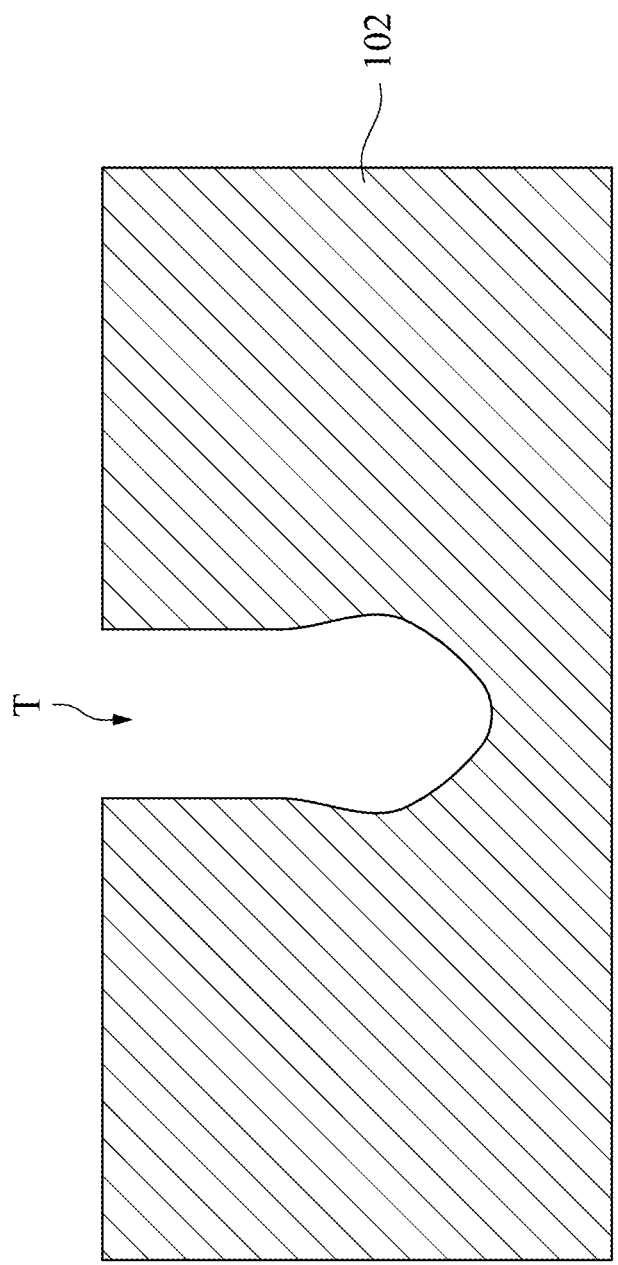

Referring, to FIG. 11, the hard mask layer 104 over the substrate 102 and the protection layers 114 along the sidewall of the trench T are removed. In some embodiments, the hard mask layer 104 and the protection layers 114 are made of similar or same materials; therefore, the hard mask layer 104 and the protection layers 114 may be removed in the same process. In some embodiments, the hard mask layer 104 and the protection layers 114 are removed by using hot phosphoric acid. Because the protection layers 114 prevent the top of the trench T from being etched, the top of the sidewalls of the trench T are still substantially vertical with respect to the top surface of the substrate 102 after the protection layers 114 are removed.

Figure 12:
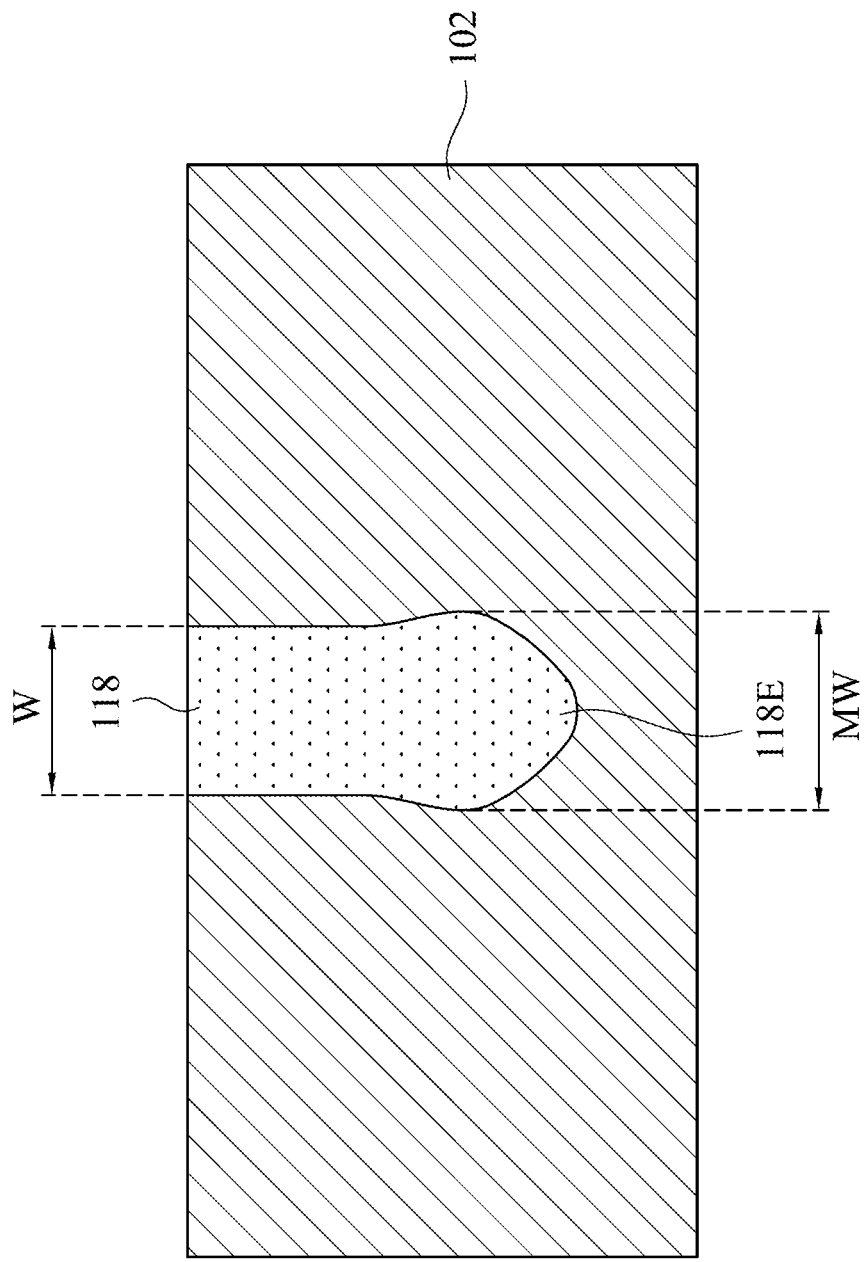

Referring to FIG. 12, a dielectric structure 118 is formed in the trench T. More specifically, a dielectric material layer may first be formed over the substrate 102 and in the trench T. A planarization process is then performed to remove the excess dielectric material layer over the substrate 102 to form the dielectric structure 118 in the trench T. The dielectric structure 118 is form by any suitable dielectric material, such as SiN, SiO, SiON, combinations thereof, or the like. The dielectric structure 118 includes an enlargement portion 118E at the bottom of the trench T. The enlargement portion 118E has a maximum width MW wider than a width W of the top of the dielectric structure 118. The enlargement portion 118E of the dielectric structure 118 is used to eliminate the disturbance resulting from the subsequently formed passing word line.

Figure 13:
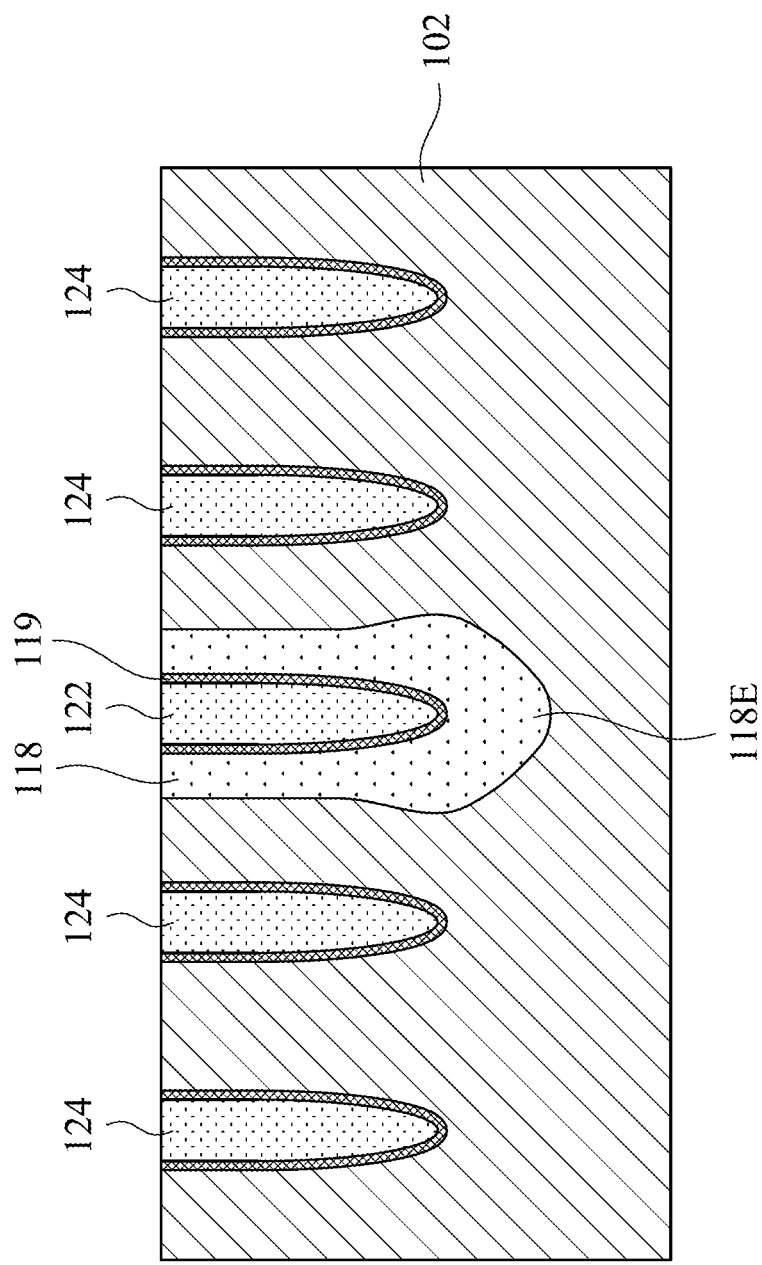

Referring to FIG. 13, a passing word line 122 is formed in the dielectric structure 118. More specifically, a trench is first formed in the dielectric structure 118. The bottom of the trench is in the enlargement portion 118E of the dielectric structure 118. A gate oxide layer 119 may be formed along the sidewall of the trench in the dielectric structure 118. A conductive material, such as metal, is then filled in the trench in the dielectric structure 118 to form the passing word line 122. During forming the passing word line 122, active word lines 124 adjacent to the dielectric structure 118 are formed simultaneously in the substrate 102. For example, some trenches are formed in the substrate 102 when the trench is formed in the dielectric structure 118. Gate oxide layers 119 may be formed along the sidewall of the trench in the substrate 102, and the conductive material is then filled in the trenches in the substrate 102 to form the active word lines 124. The active word lines 124 are separated from the dielectric structure 118 by the substrate 102. The enlargement portion 118E of the dielectric structure 118 may reduce the electric field caused by the passing word line 122, thereby eliminating the disturbance to the adjacent active word lines 124. The performance of the resulting semiconductor device may be enhanced accordingly.

Figure 14:
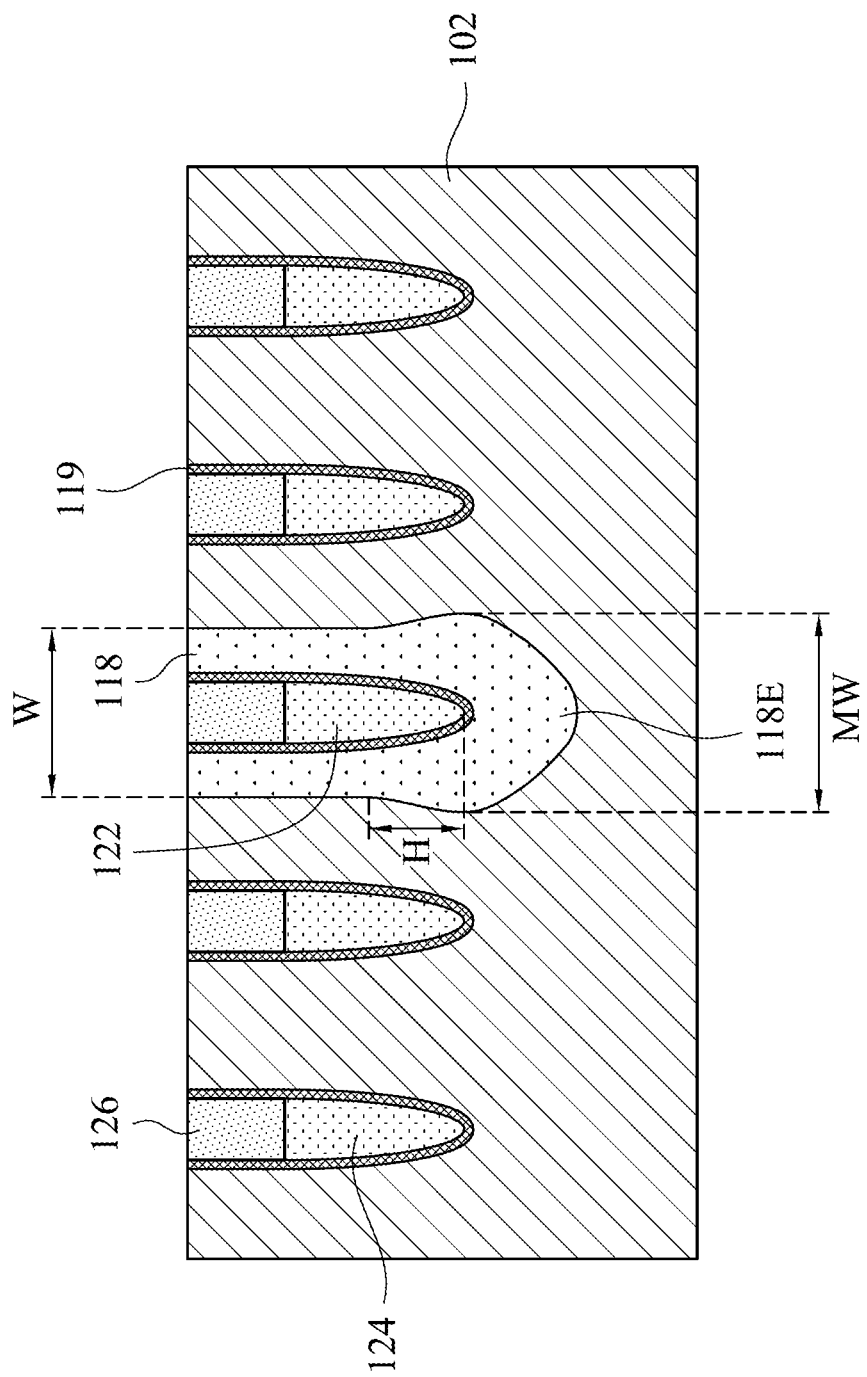

Referring, to FIG. 14, dielectric layers 126 are formed over the passing word line 122 and the active word lines 124. In some embodiments, the dielectric layers 126 are made of silicon nitride or other suitable dielectric materials. In some embodiments, the dielectric layers 126 are formed by CVD, PVD, ALD, or other suitable process.

In some embodiments, the method of forming the dielectric layers 126 may include performing an etch-back method to remove top portions of the passing word line 122 and the active word lines 124, forming dielectric materials to cover the etched passing word lines 122 and the etched active word lines 124, and performing a planarization operation, e.g., a chemical mechanical polishing (CMP) method, such that an excessive portion of the dielectric materials outside the trenches is removed to form the dielectric layers 126 respectively above the etched passing word lines 122 and the etched active word lines 124.

The resulting semiconductor device is show in FIG. 14. The semiconductor device includes the substrate 102, the passing word line 122 in the substrate 102, and the dielectric structure 118 surrounding the passing word line 122. The dielectric structure 118 has an enlargement portion 118E at the bottom of the dielectric structure 118, and the maximum width of the enlargement portion 118E of the dielectric structure 118 is wider than the width W of the top of the dielectric structure 118. In some embodiments, the maximum width MW of the enlargement portion 118E of the dielectric structure 118 is about 1 nm to about 10 nm wider than the width W of the top of the dielectric structure 118. If the maximum width MW is out of the disclosed range, the enlargement portion 180E of the dielectric structure 118 may not efficiently reduce the electric field caused by the passing word line 122, or the dielectric structure 118 may be in contact with the active word lines 124 to adversely affect the active word lines 124.

The dielectric structure 118 has the sidewall substantially vertical to the top of the dielectric structure 118, and the sidewall expands outwards at a height H above a bottom of the passing word line 122, and the height H is about 10 nm to about 20 nm above the bottom of the passing word line 122. If the height is less than 10 nm, the enlargement portion 180E of the dielectric structure 118 may not efficiently reduce the electric field caused by the passing word line 122. If the height H is greater than 20 nm, the size of the active region between the active word line 124 and the dielectric structure 118 may be reduced. In some other embodiments, the bottom of the passing word line 122 is substantially leveled with the enlargement portion 118E at the maximum width. As such, the electric field caused by the passing word line 122 is reduced to eliminate the disturbance from the passing word line 122 to the adjacent active word lines 124.

The semiconductor device further includes active word lines 124 adjacent to the dielectric structure 118, and the active word line 124 is separated from the dielectric structure 118 by the substrate 102. The semiconductor device also includes dielectric layers 126 over the passing word line 122 and the active word lines 124.

Figure 15:
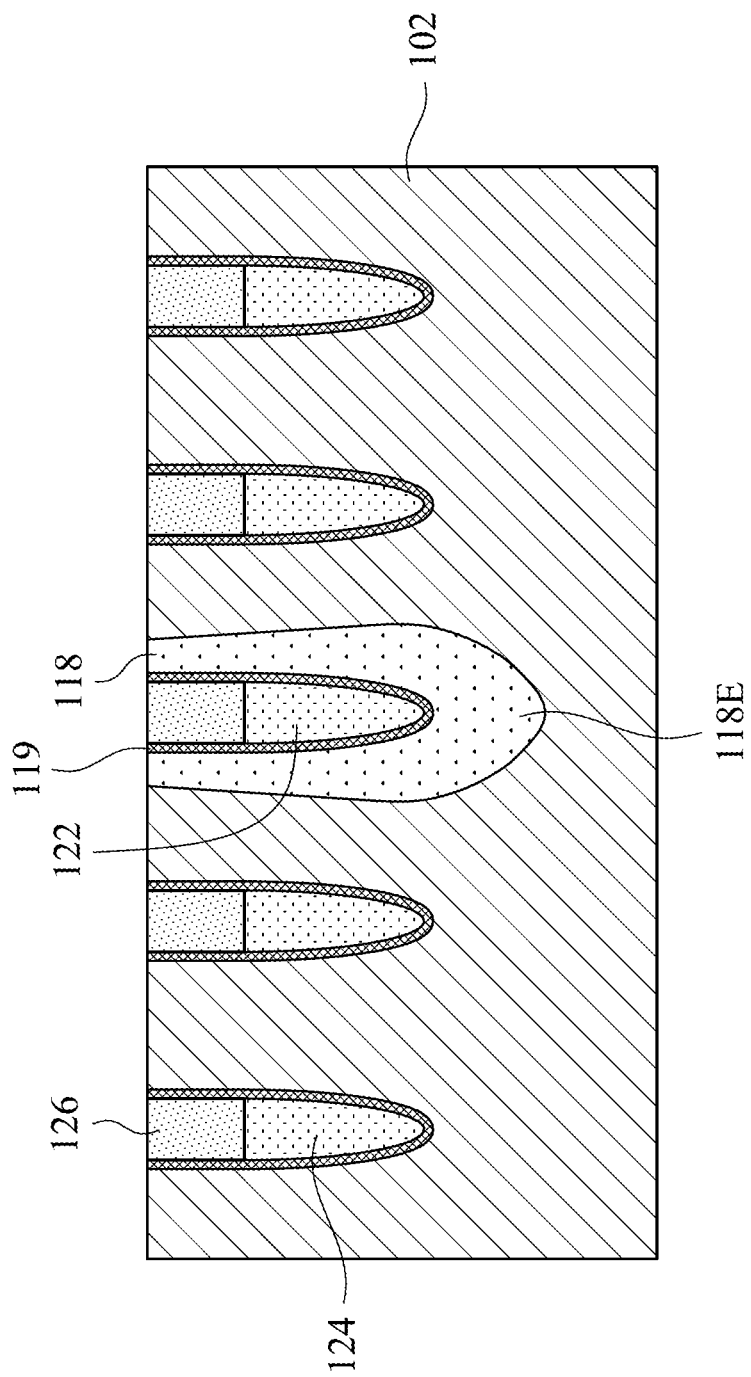
FIG. 15 illustrates a cross section view of an intermediate stage of a manufacturing method of a semiconductor device in accordance with some other embodiments of the present disclosure.

FIG. 15 illustrates a cross section view of an intermediate stage of a manufacturing method of a semiconductor device in accordance with some other embodiments of the present disclosure. The semiconductor device in FIG. 15 is similar to that in FIG. 14. The difference between the semiconductor device in FIG. 15 and FIG. 14 is the shape of the dielectric structure 118. In FIG. 14, the sidewall of the top of the dielectric structure 118 is substantially vertical to the top of the dielectric structure 118. On the other hands, in FIG. 15, the top of the dielectric structure 118 gets wider toward the bottom of the dielectric structure 118. While the width of the dielectric structure 118 reaches a maximum width, the dielectric structure 118 gets narrower toward the bottom of the dielectric structure 118.

In some embodiments, the semiconductor device in FIG. 15 is formed by performing a two-step etching operation. For example, an anisotropic etching is first performed, and then an isotropic etching is performed to form the shape of the dielectric structure 118 in FIG. 15. In some other embodiments, a patterned photoresist layer over the hard mask layer 104 (referring to FIG. 3) is formed with undercut-shaped openings therein. That is, the openings in the patterned photoresist layer are wider as getting close to the top surface of the hard mask layer 104. When using the patterned photoresist layer with the undercut-shaped openings therein to perform the first etching process, the shape of the trench T in FIG. 3 is able to be formed with greater width at the bottom portion. The resulting dielectric structure 118 is able to be formed in the shape shown in FIG. 15.

As discussed above, some embodiments of the present disclosure provides some advantages. For examples, the dielectric structure with the enlargement portion at the bottom can reduce the high electric field caused by the passing word line. Therefore, the electric field is reduced and does not affect or only slightly affect the active word lines adjacent to the dielectric structure. The performance of the semiconductor device is accordingly enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor device, comprising:
    forming a hard mask layer over a substrate;
    performing a first etching operation by the hard mask layer to form a trench in the substrate;
    forming a sacrificial layer at a bottom of the trench;
    forming a protection layer along a sidewall of a top of the trench;
    removing the sacrificial layer at the bottom of the trench such that a sidewall of the bottom of the trench is exposed;
    performing a second etching operation to widen the bottom of the trench;
    removing the hard mask layer over the substrate and the protection layer along the sidewall of the trench;
    forming a dielectric structure in the trench; and
    forming a passing word line in the dielectric structure.

2. The manufacturing method of claim 1, wherein forming the protection layer along the sidewall of the trench comprises:
    conformally forming a dielectric layer over the hard mask layer, the sacrificial layer and along the sidewall of the top of the trench; and
    etching back the dielectric layer over the hard mask layer and the sacrificial layer, such that the dielectric layer remaining along the sidewall of the top of the trench becomes the protection layer along the sidewall of the top of the trench.

3. The manufacturing method of claim 1, further comprising:
    forming a photoresist layer over the hard mask layer, and the photoresist layer exposes the protection layer and the sacrificial layer in the trench before removing the sacrificial layer at the bottom of the trench.

4. The manufacturing method of claim 1, wherein the trench is widened from the protection layer along the sidewall of the trench.

5. The manufacturing method of claim 1, wherein forming the sacrificial layer at the bottom of the trench comprises:
    depositing a sacrificial material in the trench; and
    etching back the sacrificial material to remove a portion of the sacrificial material at the top of the trench such that the sacrificial layer is formed at the bottom of the trench.

6. The manufacturing method of claim 1, further comprising forming an active word line adjacent to the dielectric structure during forming the passing word line, wherein the active word line is separated from the dielectric structure by the substrate.

7. The manufacturing method of claim 1, wherein the second etching operation is a wet etching process.

8. The manufacturing method of claim 1, wherein the bottom of the trench is widened such that a maximum width of the bottom of the trench is about 1 nm to about 10 nm wider than a width of the top of the trench.

9. The manufacturing method of claim 1, further comprising forming a dielectric layer over the passing word line.

* * * * *